US 6,591,327 B1

(12) United States Patent
Briner et al.

(10) Patent No.: US 6,591,327 B1
(45) Date of Patent: Jul. 8, 2003

(54) FLASH MEMORY WITH ALTERABLE ERASE SECTOR SIZE

(75) Inventors: Mike Briner, San Jose, CA (US); David Sweetman, Milpitas, CA (US); Tam Nguyen, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/338,451

(22) Filed: Jun. 22, 1999

(51) Int. Cl.$^7$ ............................................ G06F 12/00
(52) U.S. Cl. ................... 711/103; 711/171; 711/173; 365/185.11; 365/185.25
(58) Field of Search ............................. 711/103, 171, 711/173; 365/185.11, 185.25, 185.37, 200

(56) References Cited

U.S. PATENT DOCUMENTS

| | | | | |
|---|---|---|---|---|
| 5,029,130 A | | 7/1991 | Yeh ........................ 365/185.31 |
| 5,479,638 A | * | 12/1995 | Assar et al. ................. 711/103 |
| 5,524,230 A | * | 6/1996 | Sakaue et al. .............. 711/103 |
| 5,572,054 A | | 11/1996 | Wang et al. ................. 257/322 |
| 5,646,890 A | * | 7/1997 | Lee et al. ................. 365/185.11 |
| 5,687,121 A | * | 11/1997 | Lee et al. ................. 365/185.11 |
| 5,691,945 A | * | 11/1997 | Liou et al. ................... 365/200 |
| 5,768,193 A | * | 6/1998 | Lee et al. ................. 365/185.25 |
| 5,822,251 A | * | 10/1998 | Bruce et al. .............. 365/185.33 |
| 5,867,430 A | | 2/1999 | Chen et al. ............. 365/189.04 |
| 5,930,826 A | * | 7/1999 | Lee et al. ..................... 711/163 |
| 5,949,713 A | * | 9/1999 | Bedarida et al. ........ 365/185.11 |
| 5,995,415 A | * | 11/1999 | Kuo et al. .............. 365/185.11 |
| 6,005,803 A | * | 12/1999 | Kuo et al. .............. 365/185.11 |
| 6,088,264 A | * | 7/2000 | Hazen et al. ........... 365/185.11 |
| 6,145,050 A | * | 11/2000 | Kaki et al. .............. 365/185.29 |
| RE37,419 E | * | 10/2001 | Hsu et al. ............... 365/185.11 |
| 6,401,164 B1 | * | 6/2002 | Bartoli et al. ................ 711/103 |

OTHER PUBLICATIONS

Data Sheeet for AM29DL800B, 8 Megabit (1 M×8=Bit/512 K×16–Bit) Publication #21519, Rev: B, dated Feb. 1999.

* cited by examiner

Primary Examiner—Glenn Gossage
Assistant Examiner—Brian R. Peugh
(74) Attorney, Agent, or Firm—Gray Cary Ware & Freidenrich LLP

(57) ABSTRACT

A flash memory comprises an address bus, a data bus, control lines, and an array of addressable nonvolatile memory cells, connected to the address bus and the data bus. A latch, activated by control signals, stores signals supplied from the address bus or the data bus. A decoder decodes the signal stored in the latch, and in response to a first signal decoded for partitioning the array of memory cells into a plurality of first sectors each having a first size, and in response to a second signal decoded for partitioning the array of memory cells into a plurality of second sectors each of a second size, different from the first size. A control circuitry controls the erasure of a first or a second sector of the memory array in response to the first or second signal decoded.

9 Claims, 5 Drawing Sheets

FLASH MEMORY WITH ALTERABLE ERASE SECTOR SIZE

FIELD OF THE INVENTION

The present invention relates to flash memories, and more specifically, to a flash memory having alterable erase sector size, such that virtual separation of data and code in a physical bank of flash memory can occur. Further, with two or more physical banks of memory, multiple concurrent operations can occur.

DESCRIPTION OF THE PRIOR ART

Flash memories have emerged in the art in recent years as an important nonvolatile memory which combines the advantages of EPROM density with EEPROM electrical eraseability.

Flash memories are so named because a plurality of memory cells in a block or sector are erased at the same time. Thereafter, selected bits, bytes, or words are programmed. Flash memories have been used to store program code and data. For storage of data, it is desirable to have the sector size small, so that only a small number of bits of memory cells are erased and then programmed. On the other hand, for storage of program code, it is desirable to have the sector size large, so that a large number of memory cells are erased at the same time. It is further desirable to have a plurality of physically separate banks of memory cells with one bank for storing program code and the other for storing data. Thus, two operations, such as read from program bank while writing to the data bank can occur at the same time. In addition, with the two banks of memories storing different types of information (program code vs. data) thereby requiring different erase sector sizes, it becomes desirable to have two physical banks of flash memories with each memory bank having the option of a unique erase sector size.

Thus, in the prior art a flash bank memory system has multiple banks of memory: one to store program or code and the other to store data. The banks are physically separate, i.e. different physical locations within the system (die) and are addressed by different internal address lines. In addition, each bank has separate bit lines, allowing for two concurrent operation, such as simultaneous read from the code bank and write to the data bank.

However, a significant disadvantage of this prior art flash bank memory system arises since different applications often require different amounts of storage in each of the banks. For example, one application may require a memory bank in which one bank has a storage density of 7 Megabits, while the other bank has a storage density of only 1 Megabits. On the other hand, another application may require a memory bank in which one bank has a storage density of 6 Megabits, while the other bank has a storage density of 2 Megabits. This has necessitated the manufacturer of the memory system to maintain an inventory of different sizes of the memory banks.

FIG. 1 represents a flash memory system 1 of the prior art. In the flash memory 1 of FIG. 1, there are two different sized memory banks 2a and 2b. For example, memory bank 2a may be a 1 Megabit memory bank, with a minimum erase sector size of 4K bytes, whereas memory bank 2b is a 7 Megabit memory bank with an erase sector size of 32K byte sectors, each byte comprising 8 bits. Often memory bank 2a will consist of boot and parameter blocks, e.g. 16K byte sector plus 8K byte sectors etc.

Memory bank 2b has a $\overline{CE}$, i.e. chip enable, line and a $\overline{WE}$, i.e. write enable, line. Further the memory banks 2a and 2b are physically separated using different address lines, i.e. address bus 3, consisting of memory address bits A0–A18. Although the memory banks 2a and 2b are physically separate, they may be virtually continuous in the address range. Thus, for example, the memory bank 2a can be addressed in a different address space, from the memory bank 2b, within the common address range A0–A18. It is important to note that each memory bank 2a and 2b has separate address line latches and bit lines.

Typically, program or code is stored in one of the memory banks, e.g. memory bank 2b, while data is stored in the other memory bank, e.g. memory bank 2a. As a result, it is possible to perform concurrent operations on each bank. That is, it is possible, for example, to write data to memory bank 2a while concurrently reading program or code from memory bank 2b. The program or code read from memory bank 2b can be the code to control the write operation of data to the other memory bank 2a.

In operation, one memory bank will be written with data while the other will store the program which is read for execution by the controller. However, as described above, for this type of flash memory system, a problem emerges in requiring specific sized memory banks for specific applications. Therefore, for these applications that require specific sized memory banks, different memories have to be fabricated, and inventoried. See also U.S. Pat. No. 5,867,430 for a disclosure of two banks with the ability to perform simultaneous operations on the two banks concurrently.

Flash memories responsive to Software Data Protect (SDP) Commands are also well known in the art. In fact, the SDP Commands are standardized by the JEDEC organization (JEDEC Standard 21-C). In a SDP Command, certain signals supplied on either the address bus and/or the data bus to a byte alterable or flash EEPROM nonvolatile memory is interpreted by the nonvolatile memory to perform certain functions commands, such as erase or program (which must be precede by erase for a write operation). Thus, within the nonvolatile memory, there are latches to store the signals from the address and data bus, a decoder to decode the signal stored in the address latch and a control circuitry responsive to the decoder to control the operation of the nonvolatile memory, such as program or erase.

SUMMARY OF THE INVENTION

A flash memory comprises an address bus, a data bus, and one or more arrays of addressable nonvolatile memory cells, connected to the address bus and the data bus. Latches store signals supplied from the address bus and the data bus. A decoder decodes the signal stored in the latch, and in response to a first signal decoded for partitioning the array of memory cells into a plurality of first sectors each having a first size, and in response to a second signal decoded for partitioning the array of memory cells into a plurality of second sectors each of a second size, e.g. blocks, different from the first size. A control circuitry controls the erasing of a first or a second sector of the memory array in response to the first or second signal decoded.

DETAILED DESCRIPTION OF THE DRAWINGS

Figure 1:
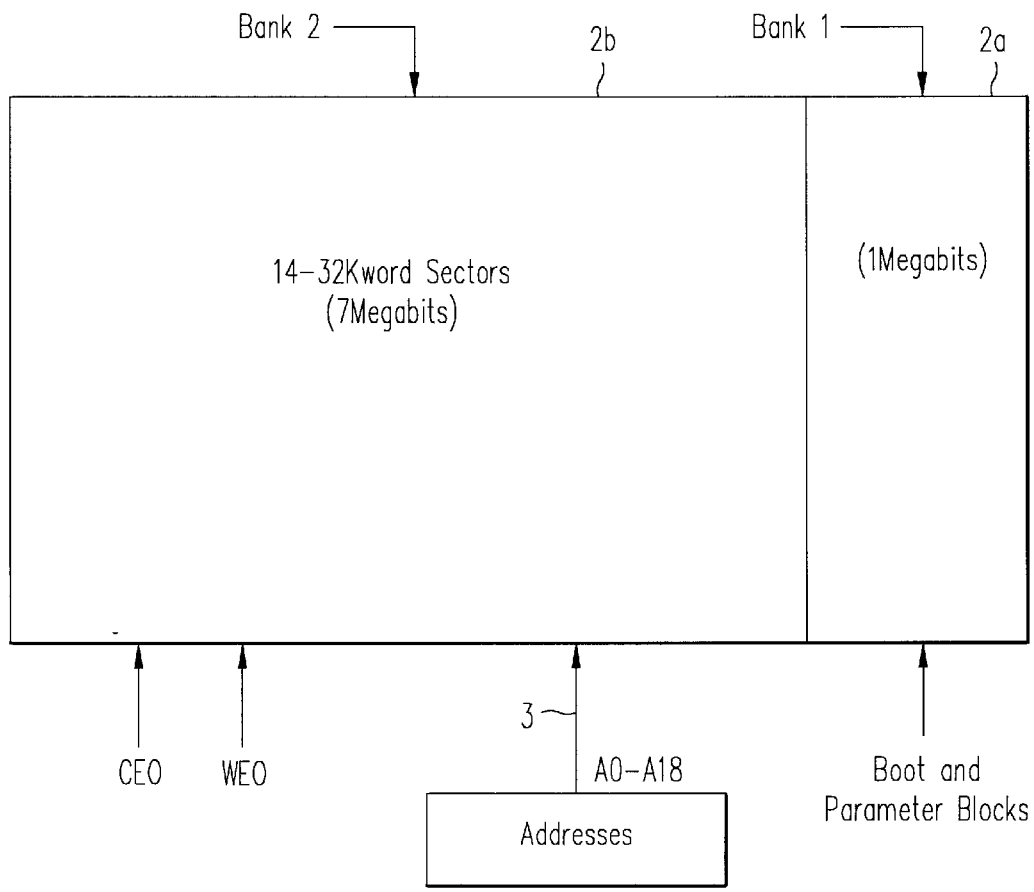
FIG. 1 is a bank flash memory system of the prior art.
Figure 2:
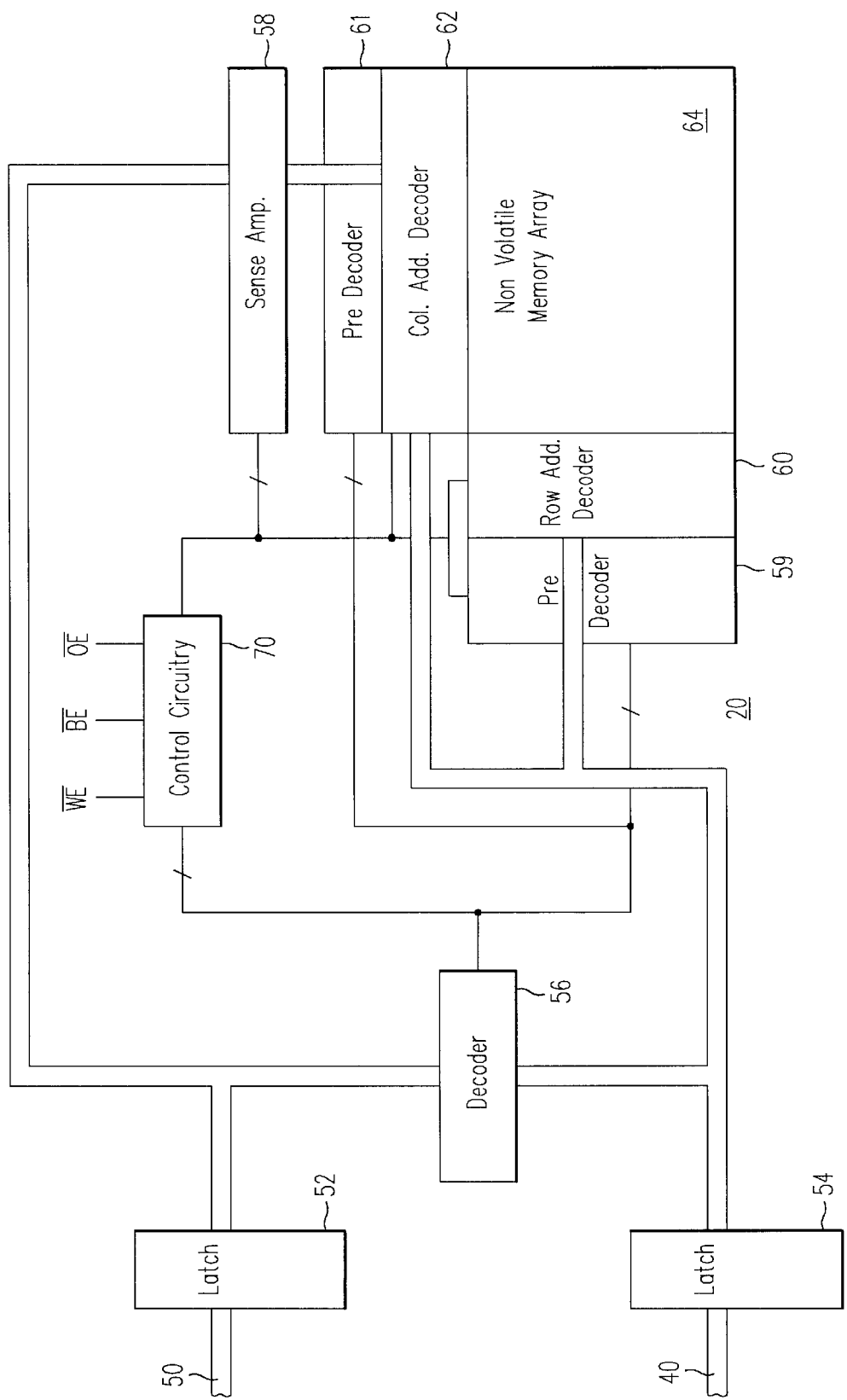
FIG. 2 is a schematic block diagram of a flash memory of the present invention.

Referring to FIG. 2, there is shown a schematic block diagram of a flash memory 20 of the present invention. The flash memory 20 has a first latch 52 to store the data signal supplied from a data bus 50 or to be supplied to the data bus 50. The flash memory 20 further comprises a second latch 54 to store an address signal supplied from the address bus 40. The signals stored in either the first latch 52 or the second latch 54, or both are supplied to a decoder circuit 56. The decoder circuit 56 determines whether the signals stored in the latches 52 and/or 54 are to be interpreted as commands for the flash memory 20 to execute. This is all in accordance with the JEDEC standard, and is known as the SDP commands, and is well known in the art.

From the first latch 52, the signals are also supplied to column address decoder 62 in the case of data signals supplied to the flash memory 20 (or from the sense amplifier 58 to the latch 52 in the case of data output from the flash memory 20). From the second latch 54, the signals are also supplied to the row address decoder 60 and the column address decoder 62, which then addresses the nonvolatile memory array 64. Finally, a control circuit 70 receives the output of the decoder 56 and also receives the bank enable signal $\overline{BE}$, the write enable signal $\overline{WE}$, and the output enable signal $\overline{OE}$, and in response thereto, controls the operation of the sense amplifier 58, and row and column address decoders 60 and 62. In the prior art, it is well known that the control circuitry 70 can control the high voltage generators (not shown) and other circuitry necessary to program at a byte level.

In the present invention, the nonvolatile electrically erasable memory array 64 is preferably composed of nonvolatile memory cells of the type shown and described in U.S. Pat. Nos. 5,029,130 and 5,572,054, whose disclosures are incorporated herein by reference. As disclosed in those references, the memory cell erases through the mechanism of Fowler-Nordheim tunneling from the floating gate to the control gate, which is connected along the word line. The high voltage applied to a word line causes the erasure of all memory cells connected to that word line. Thus, the minimum erase element is a word line. Since the minimum erase element is a single word line, one can choose different combinations of multiple word lines for simultaneous erase, resulting in selectable different sector sizes for erase operations.

The output of the decoder 56 is also supplied to a column pre-decoder 61 and to a row pre-decoder 59. When the decoder 56 detects a combination of address and/or data signals as meaning command to erase a sector of a certain size in the array 64, the decoder 56 supplies the appropriate address signals to the pre-decoders 59 and 61 so that the appropriate bank sector or block size is erased.

Figure 3:
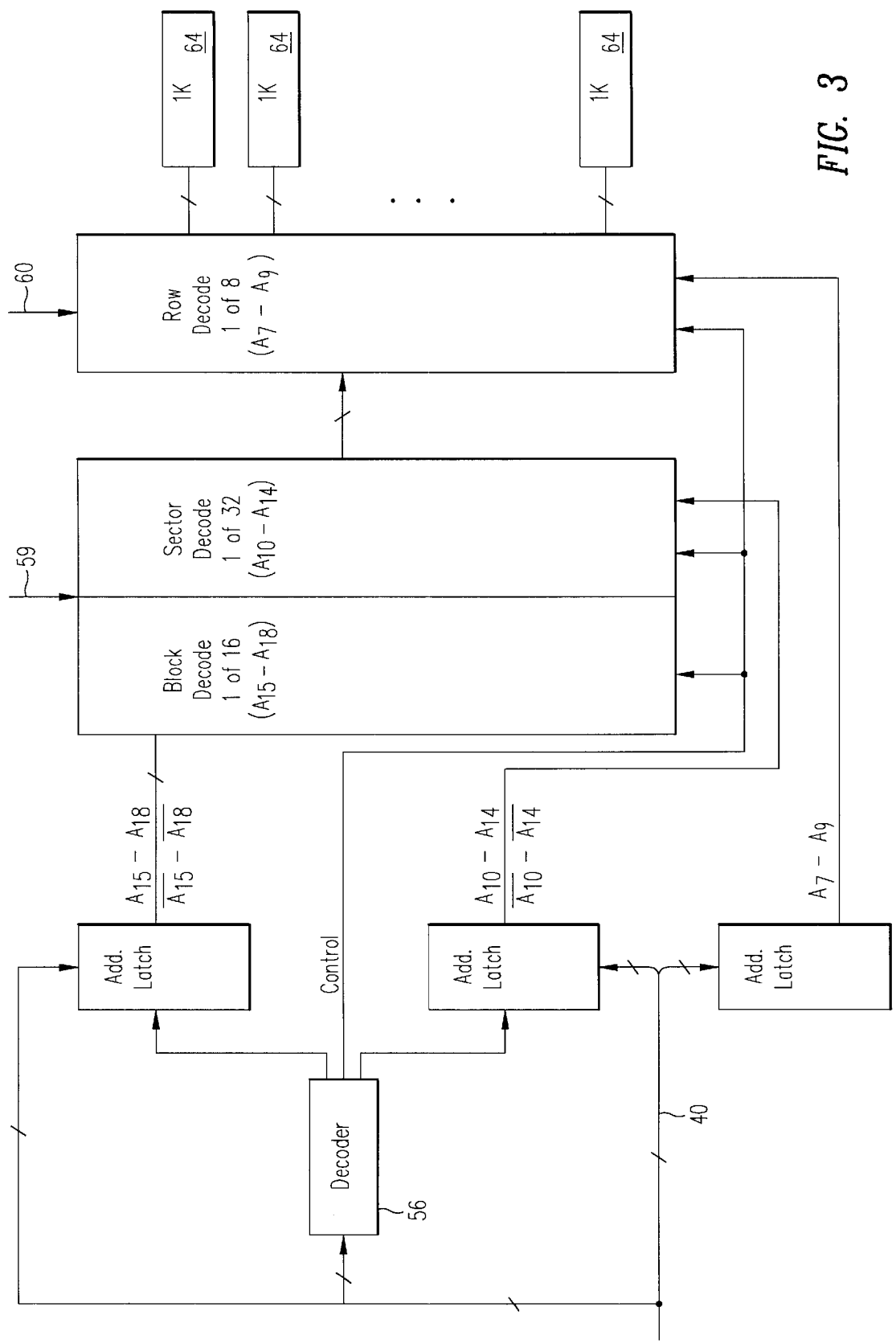
FIG. 3 is a detailed circuit diagram of a pre-decoder portion of the flash memory shown in FIG. 2.

Referring to FIG. 3 there is shown a detailed schematic diagram of a portion of the row pre-decoder 59 along with the associated row decoder 60. The operation of the column pre-decoder 61 with the column decoder 60 would be similar. As shown in FIG. 3, the memory array 64 is divided into a plurality of sectors of 1K 16 bit word size. Each of the 1K word sector has an associated row decoder 60 and a pre-decoder 59. In the preferred embodiment, the memory array 64 is 512K words, thereby requiring 19 address lines ($A_0$–$A_{18}$) to address the 512K. The memory 20 can erase in one of three modes: bank, block and sector. In bank erase, the entire 512K words are erased. In block erase, a block of 32K words is erased. Finally, in sector erase, a sector of 1K word is erased. The address lines of $A_7$–$A_9$ are supplied from the address bus 40 to the row decoders 60 and the address lines of $A_0$–$A_6$ are supplied from the address bus 40 to the column decoders 61. The address lines of $A_{10}$–$A_{18}$ are supplied from the decoder 56 to the row pre-decoders 59.

For sector selection, the address lines $A_{10}$–$A_{18}$ are used. For block selection, the address lines $A_{15}$–$A_{18}$ are used. Finally for bank selection, the bank selection signal generated by the decoder 56 over-rides all address signals.

In the operation of the flash memory 20 of the present invention, the flash memory 20 uses Software Data Protect (SDP) Commands to erase the memory array 64. The commands for erase all follow the following data/address pattern (in hexadecimal):

| Bus Cycle | Address Bus | Data Bus |
|---|---|---|
| 1st | 5555 | AA |
| 2nd | 2AAA | 55 |
| 3rd | 5555 | 80 |
| 4th | 5555 | AA |
| 5th | 2AAA | 55 | with the pattern differing in the sixth cycle between bank, block and sector erase. In the case of bank erase, the address/data pattern is ($5555/10$) respectively. In the case of block erase, the address/data pattern is (block address/50) respectively. Finally, for sector erase, the address/data pattern is (sector address/30) respectively.

When the decoder 56 recognizes the address/data pattern as meaning bank erase, the decoder 56 causes the control circuitry to generate the necessary signals to cause the entire memory array 64 to be erased. This is well known in the art. When the decoder 56 recognizes the address/data pattern as meaning block erase, the decoder 56 causes the necessary signals to be generated by the control circuitry 70, all of which is well known in the art. However, in addition, the decoder 56 supplies control signals to override the address signals $A_7$–$A_{14}$ and the complement signals $\overline{A_7}$–$\overline{A_{14}}$, in the row pre-decoders 59 and the row decoder 60, thereby causing a selected block of 32 1K word sectors to be erased. When the decoder 56 recognizes the address/data pattern as meaning sector erase, the decoder 56 causes the necessary signals to be generated by the control circuitry 70, all of which is well known in the art. However, in addition, the decoder 56 supplies control signals to override the address signals $A_7$–$A_9$ and the complement signals $\overline{A_7}$–$\overline{A_9}$, in the row decoders 60, to select one associated sector of 1K words to be erased.

Thus, based upon the ability of the flash memory 20 to erase various sector sizes in the same physically contiguous memory array 64, program code and data can be stored in the same physical memory array, with the partitioning between the two being changeable.

Further, in the operation of the flash memory 20, even though the memory array 64 can operate in a flash mode, i.e. erasure of all the memory cells of a sector at the same time, the erasure of a 32K block would take longer than the erasure of a 1K sector. As will be discussed hereinafter, this may necessitate the decoder 56 and the control circuitry 70 of one of the memory banks 20 to be able to recognize and execute an interrupt command.

Figure 4:
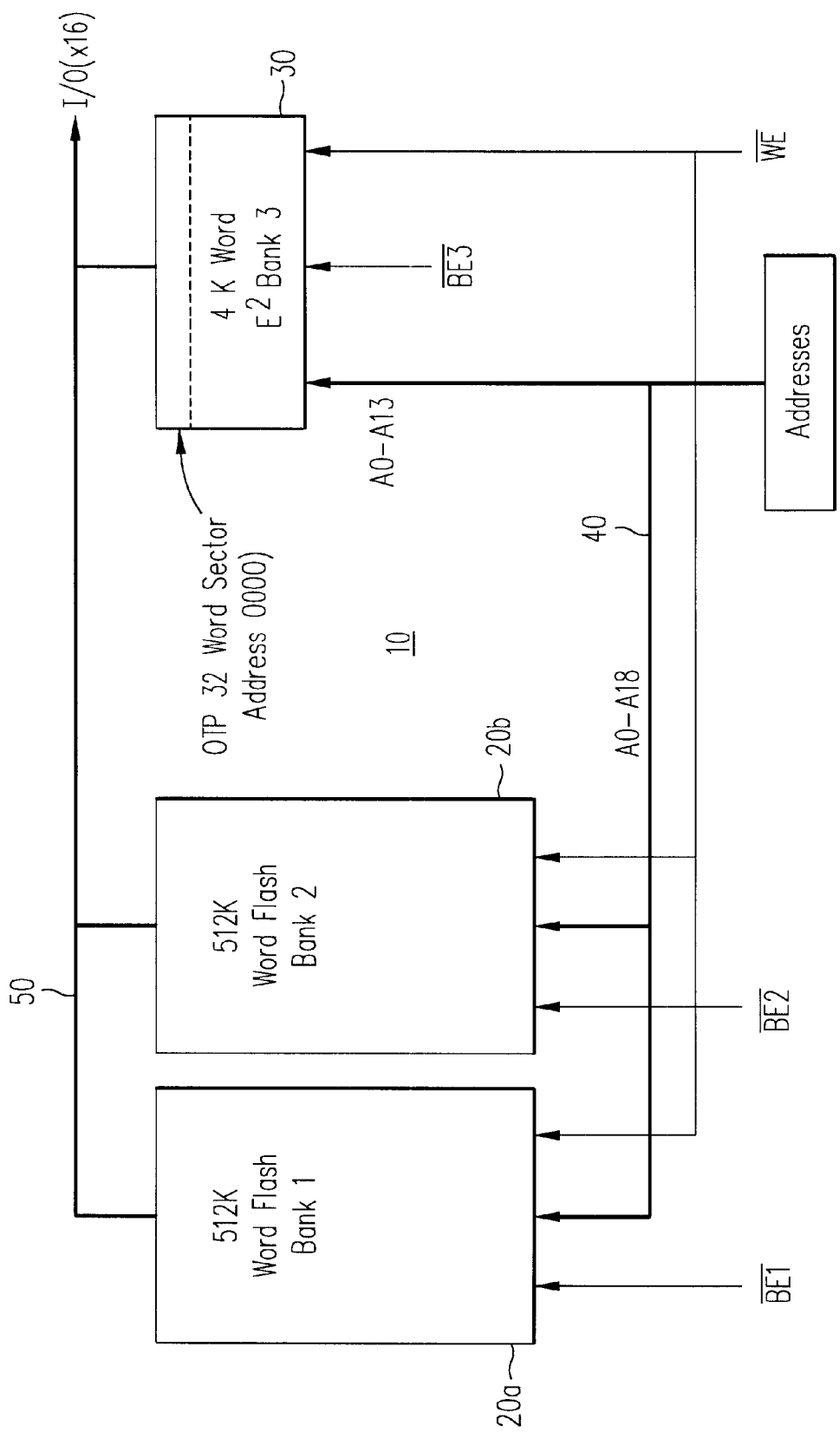
FIG. 4 is a block diagram of a flash memory bank system using the flash memory of the present invention.

Referring to FIG. 4, there is shown a nonvolatile memory system 10 using the flash memories 20 of the present invention. A first bank of nonvolatile memory 20a, is combined with a second bank of nonvolatile memory 20b, physically separate from the first bank 20a. Each of the first and second banks 20a and 20b are of the type shown and described in FIG. 2. Memory banks 20a and 20b need not be the same size. However, typically memory banks 20a and 20b have the same densities. For example, each of the first and second memory banks 20a and 20b may be a 512K×16 flash array (512K words, with each word being 16 bits for a total of 8 Megabits).

Each of the memory banks 20a and 20b is connected to the same address bus 40 and is capable of receiving an address signal from the address bus 40. The address bus 40 has a bus width of at least A0–A18 bits, to address 512K words for a total of 8 Megabits in each of the memory banks 20a or 20b. The A0–A18 bits are provided from an address buffer (not shown). Each of the memory banks 20a and 20b is preferably provided with a separate bank enable signal ($\overline{BE1}$ or $\overline{BE2}$). However, with two memory banks 20a and 20b, one of the bank enable signals can be the inverse of the other, thereby functioning as an address or bank select signal. A memory bank 20 (a or b) is selected when its associated $\overline{BE}$ line ($\overline{BE1}$ or $\overline{BE2}$) is active (LOW). The data output/input of the memory banks 20a and 20b, are connected to a bi-directional data bus 50, which is 16 bits wide. The data bus 50 permits each of the memory banks 20a or 20b to output its data onto the data bus 50 or for data signals from the data bus 50 to be supplied to the memory banks 20a or 20b.

In the embodiment shown in FIG. 4, the memory banks 20a and 20b are addressed by banks, as well as by addresses. That is, each memory bank 20a and 20b is addressed by means of its associated separate bank enable ($\overline{BE}$) line, and by the address signals supplied on the address bus 40. Therefore, flash memory bank 20a is addressed by enabling line $\overline{BE1}$ (setting $\overline{BE1}$ LOW), and by the address signal supplied on the address bus 40. Flash memory bank 20b is addressed by enabling line $\overline{BE2}$ (setting $\overline{BE2}$ LOW), and by the address signals supplied on the address bus 40. Therefore, each of flash memory banks 20a and 20b can receive address bits A0–A18 from the address bus 40, depending on which of the flash memory banks 20a or 20b is selected. In addition, data signals from the data bus 50 is also supplied to the selected memory bank 20a or 20b by the selection of the particular $\overline{BE}$ signal.

Figure 5:
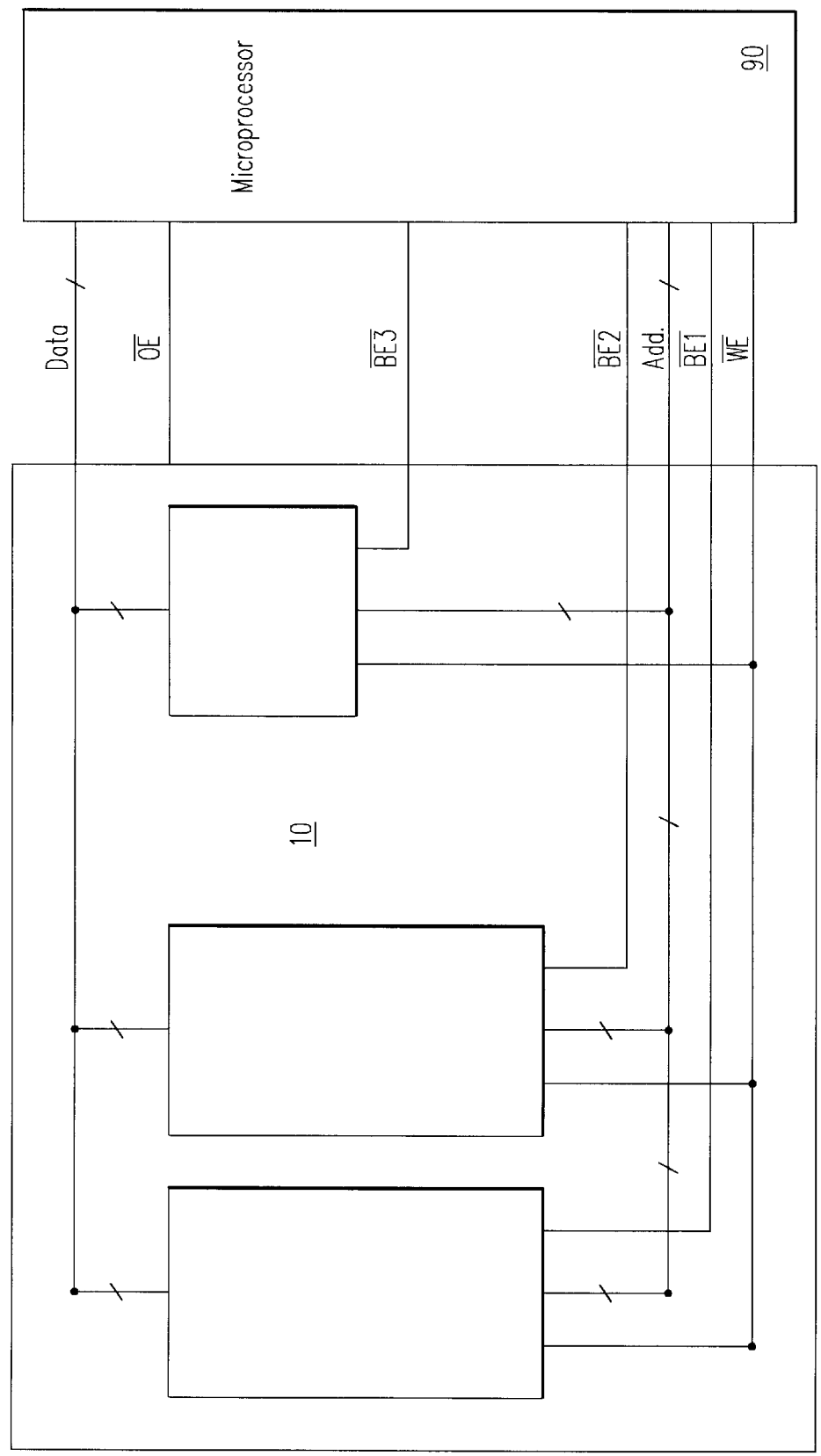
FIG. 5 is a schematic block diagram of the flash memory bank system shown in FIG. 4 interfaced with a microprocessor.

Because each of the memory banks 20 has erase and program capability (along with read) and because the memory banks 20a and 20b are physically separate, with each of the memory array 64 of each of the memory banks 20 having independent bit lines and address latches, the memory system 10 allows for simultaneous read/write operations. For example, one memory bank, e.g. 20a, can be writing data while the other memory bank 20b will read the program which is read for execution by a microcontroller or a microprocessor 90, shown in FIG. 5, which can be external to the memory system 10, or can be integrated with the memory system 10 on a single silicon chip.

Because flash memory cells take a relatively long period of time to erase and to program (compared to read), it is possible that during the erase operation in one memory bank, e.g. bank 20a, the microcontroller or microprocessor 90 may request a read operation from that bank 20a. In that event an interrupt to that memory bank 20a occurs. The decoder 56 and the control circuitry 70 of memory bank 20a can also be adapted to respond to an interrupt, e.g. a request to read a particular address, while an erase or program operation is still underway. The control circuitry 70 may choose to service the interrupt in one of two ways. If the interrupt occurs while the memory array 64 is in the first erase mode, i.e. erasure of only a 1K sector, or if the interrupt occurs while the memory array 64 is near the completion of the second erase mode, i.e. erasure of a data sector 32 k words, then the control circuitry 70 may choose to delay the execution of the read command, until the erase command has been completed. Alternatively, the control circuitry 70 may choose to service the read command (so long as the read address is not to an address to be programmed), and to resume the erase or program command after executing the read operation.

It should be noted that it is not necessary to duplicate the ability to service the interrupt command in both of the memory banks 20a and 20b. So long as one of the memory banks 20 has this capability and the programmer of the microcontroller or microprocessor 90 is aware of which memory bank 20 has this capability, the programmer can then select the memory bank to take advantage of this feature. Alternatively, of course, both memory banks 20a and 20b can have this feature.

Since the memory system 10 is capable of reading and writing simultaneously, in both of the banks 20a and 20b, the location of the program (to read) and of the data (to write) becomes almost inconsequential. Therefore, each memory bank 20 can store both program and data with the separation between program and data being a virtual separation, determined by the erase sector size, as previously discussed. Of course, for optimal performance of the memory system 10, in some cases it still may be desirable to physically separate data and program between the two physically separate memory banks. However, this is not necessary, and the programmer can store program and data in the same physical memory bank 20.

Referring to FIG. 4, the memory system 10 is shown as further comprising a third memory bank 30. The third memory bank 30 is not necessary to understand the present invention. The third memory bank 30 is also a memory array of electrically erasable nonvolatile memory. In the preferred embodiment, the third memory bank 30 is byte alterable E$^2$PROM with one sector having OTP (One Time Programmable) capability. Thus, the third memory bank 30 may be altered one word at a time with a single command.

The third memory bank 30 is also connected to the same address bus 40, as that supplied to the first and second memory banks 20a and 20b. However, because the third memory bank 30 is much smaller in size (4K addressable words with each word also 16 bits, for a total of 64 Kbits) than either of the first or second memory banks 20a and 20b, only the address lines A0–A13 are supplied to the third memory bank 30. The third memory bank 30 is also connected to the data bus 50 and supplies the data signals thereto or receives the data signals therefrom. Finally, the third memory bank 30 receives a separate bank enable signal $\overline{BE3}$, and the same write enable signal $\overline{WE}$, and $\overline{OE}$ output enable signal, which is also supplied to the first and second memory banks 20a and 20b.

The third memory bank 30 can erase in 32 word sectors and word program or perform a single word write which consists of word erase followed by the word program operation. Further the first sector of the third memory bank 30 offers the option of OTP (One Time Programmable) preventing writing of the first sector, once it is written. This can be used to protect critical data or code.

What is claimed is:

1. A flash memory comprising:
   an address bus;
   a data bus;

an array of addressable nonvolatile memory cells, connected to said address bus and said data bus;

a latch for storing signals supplied from said address bus and said data bus;

a decoder for decoding said signals stored in said latch, and in response to a first combination of said signals stored in said latch, said decoder for selecting a plurality of first nonvolatile memory cell sectors each of a first size, and in response to a second combination of said signals stored in said latch, said decoder for selecting a plurality of second nonvolatile memory cell sectors each of a second size, different from said first size; and control circuitry for controlling the erasure of at least one of the selected plurality of first sectors and at least one of the selected plurality of second sectors of said memory array in response to said first and second signal combinations, respectively;

wherein each of said second sectors comprises a plurality of said first sectors.

2. The flash memory of claim 1 wherein said decoder supplies a plurality of address signals to said plurality of first sectors in response to said second combination of signals stored in said latch.

3. The flash memory of claim 1 wherein said latch further comprises a first latch for storing the signals supplied from said address bus and a second latch for storing the signals supplied from said data bus.

4. A flash memory bank system comprising:

a first bank of addressable nonvolatile memory cells;

a second bank of addressable nonvolatile memory cells, physically separate from said first bank;

an address bus connected to said first and second banks of addressable nonvolatile memory cells for supplying an address signal to said first and second banks;

a bi-directional data bus connected to said first and second banks of addressable nonvolatile memory cells for supplying a data signal to and for receiving a data signal from said first and second banks;

a bank signal for separately activating said first and second banks;

wherein each of said first and second banks of addressable nonvolatile memory cells further comprising:

an array of addressable nonvolatile memory cells, connected to said address bus and said data bus;

a latch for storing signals supplied from said address bus and said data bus;

a decoder for decoding said signal stored in said latch, and in response to a first combination of said signals stored in said latch, said decoder for selecting a plurality of first nonvolatile memory cell sectors each of a first size, and in response to a second combination of said signals stored in said latch, said decoder for selecting a plurality of second nonvolatile memory cell sectors each of a second size, different from said first size; and control circuitry for controlling the erasure of at least one of the selected plurality of first sectors and at least one of the selected plurality of second sectors of said memory array in response to said first and second signal combinations, respectively;

wherein each of said second sectors comprises a plurality of said first sectors.

5. The flash memory of claim 4 wherein said decoder supplies a plurality of address signals to said plurality of first sectors in response to said second combination of signals stored in said latch.

6. The flash memory of claim 4 wherein said latch further comprises a first latch for storing the signals supplied from said address bus and a second latch for storing the signals supplied from said data bus.

7. The memory system of claim 4 wherein said system is connected to a microprocessor.

8. The memory system of claim 7, wherein said control circuitry of one of said first and second banks further comprises:

means for servicing an interrupt command from said microprocessor.

9. The memory system of claim 4 further comprising:

a third bank of addressable nonvolatile memory, physically separate from said first and second banks;

wherein said address bus is connected to said first, second and third banks of addressable nonvolatile memories;

wherein said bi-directional data bus is connected to said first, second and third banks of addressable nonvolatile memories; and wherein said bank signal for separately activating said first, second and third banks.

\* \* \* \* \*